US010199631B2

(12) United States Patent
Mack et al.

(10) Patent No.: US 10,199,631 B2
(45) Date of Patent: Feb. 5, 2019

(54) BIASING FEATURES FOR A BATTERY MODULE

(71) Applicant: Johnson Controls Technology Company, Holland, MI (US)

(72) Inventors: Robert J. Mack, Milwaukee, WI (US); Richard M. DeKeuster, Racine, WI (US); Jennifer L. Czarnecki, Franklin, WI (US); Ken Nakayama, Franklin, WI (US); Matthew R. Tyler, Brown Deer, WI (US); Christopher M. Bonin, South Milwaukee, WI (US); Xugang Zhang, Milwaukee, WI (US); Dale B. Trester, Milwaukee, WI (US); Jason D. Fuhr, Sussex, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 293 days.

(21) Appl. No.: 14/675,618

(22) Filed: Mar. 31, 2015

(65) Prior Publication Data

US 2016/0197331 A1 Jul. 7, 2016

Related U.S. Application Data

(60) Provisional application No. 62/100,001, filed on Jan. 5, 2015.

(51) Int. Cl.
*H01M 2/00* (2006.01)
*H01M 2/30* (2006.01)
(Continued)

(52) U.S. Cl.
CPC .......... *H01M 2/305* (2013.01); *G01R 31/362* (2013.01); *G01R 31/3658* (2013.01); *H01M 2/02* (2013.01);
(Continued)

(58) Field of Classification Search
CPC .......... H01M 2/305; H01M 2/34; H01M 2/20; H01M 2/1016; H01M 2/32; H01M 2/22; H01M 2/206
See application file for complete search history.

(56) References Cited

U.S. PATENT DOCUMENTS 5,558,949 A    9/1996  Iwatsuki et al.
6,071,643 A *  6/2000  Chino ................. H01M 2/0257
                                            429/176

(Continued)

FOREIGN PATENT DOCUMENTS

JP      2011060675        3/2011
KR      20130133118       12/2013
WO      WO-2014034079 A1 * 3/2014  .......... B60L 11/1879

OTHER PUBLICATIONS

PCT/US2016/0137410 International Search Report dated Apr. 18, 2016.

*Primary Examiner* — Nicholas P D'Aniello
(74) *Attorney, Agent, or Firm* — Fletcher Yoder, P.C.

(57) ABSTRACT

The present disclosure relates to a battery module having a housing and a stack of battery cells disposed in a receptacle area of the housing, where each battery cell has a top having a battery cell terminal and a bottom, where the top of the battery cells face outwardly away from the receptacle area. The battery module includes an integrated sensing and bus bar subassembly positioned against the stack of battery cells and has a carrier, a bus bar integrated onto the carrier, and a biasing member integrated onto the carrier. The bus bar electrically couples battery cells in an electrical arrangement, and the biasing member is between the top of each battery cell and the carrier, where the biasing member has a first material, more compliant than a second material of the carrier, and the biasing member biases the stack of battery cells inwardly toward the housing.

15 Claims, 10 Drawing Sheets

(51) Int. Cl.
*H01M 2/10* (2006.01)
*H01M 10/052* (2010.01)
*H01M 2/20* (2006.01)
*H01M 2/22* (2006.01)
*H01M 2/32* (2006.01)
*H01M 2/12* (2006.01)
*H01M 10/48* (2006.01)
*H01M 10/613* (2014.01)
*H01M 10/625* (2014.01)
*H01M 10/647* (2014.01)
*H01M 10/653* (2014.01)
*H01M 10/6551* (2014.01)
*G01R 31/36* (2006.01)
*H01M 10/0525* (2010.01)
*H01M 10/42* (2006.01)
*H01M 2/24* (2006.01)
*H01M 10/6557* (2014.01)
*H01M 2/18* (2006.01)
*H01M 10/04* (2006.01)
*H01M 10/058* (2010.01)
*H01M 2/02* (2006.01)
*H01M 2/04* (2006.01)
*H01M 2/34* (2006.01)
*H01M 10/02* (2006.01)
*H01M 10/60* (2014.01)
*H01M 10/65* (2014.01)

(52) U.S. Cl.
CPC ............ *H01M 2/04* (2013.01); *H01M 2/10* (2013.01); *H01M 2/1005* (2013.01); *H01M 2/1016* (2013.01); *H01M 2/1072* (2013.01); *H01M 2/1077* (2013.01); *H01M 2/1083* (2013.01); *H01M 2/12* (2013.01); *H01M 2/1205* (2013.01); *H01M 2/1211* (2013.01); *H01M 2/1217* (2013.01); *H01M 2/1241* (2013.01); *H01M 2/1252* (2013.01); *H01M 2/1294* (2013.01); *H01M 2/18* (2013.01); *H01M 2/20* (2013.01); *H01M 2/206* (2013.01); *H01M 2/22* (2013.01); *H01M 2/24* (2013.01); *H01M 2/30* (2013.01); *H01M 2/32* (2013.01); *H01M 2/34* (2013.01); *H01M 10/02* (2013.01); *H01M 10/0413* (2013.01); *H01M 10/052* (2013.01); *H01M 10/058* (2013.01); *H01M 10/0525* (2013.01); *H01M 10/4207* (2013.01); *H01M 10/4257* (2013.01); *H01M 10/482* (2013.01); *H01M 10/60* (2015.04); *H01M 10/613* (2015.04); *H01M 10/625* (2015.04); *H01M 10/647* (2015.04); *H01M 10/65* (2015.04); *H01M 10/653* (2015.04); *H01M 10/6551* (2015.04); *H01M 10/6557* (2015.04); *H01M 2010/4271* (2013.01); *H01M 2220/10* (2013.01); *H01M 2220/20* (2013.01)

(56) References Cited

U.S. PATENT DOCUMENTS

| | | | |
|---|---|---|---|
| 6,852,441 | B2 | 2/2005 | Milgate, Jr. et al. |
| 7,781,091 | B2 | 8/2010 | Matsuoka et al. |
| 8,399,112 | B2 | 3/2013 | Yasui et al. |
| 8,546,040 | B2 | 10/2013 | Yokoi |
| 8,703,321 | B2 | 4/2014 | Kim et al. |
| 8,703,322 | B2 | 4/2014 | Lee et al. |
| 8,785,022 | B2 | 7/2014 | Sato et al. |
| 8,785,028 | B1 | 7/2014 | Saiki |
| 2005/0079408 | A1 | 4/2005 | Hirano |
| 2006/0286441 | A1* | 12/2006 | Matsuoka ............ H01M 2/105 429/99 |
| 2012/0247107 | A1 | 10/2012 | Balk et al. |
| 2012/0258335 | A1 | 10/2012 | Bae |
| 2013/0236745 | A1 | 9/2013 | Norton |
| 2015/0144409 | A1* | 5/2015 | Fujii ................. B60L 11/1879 180/65.1 |

\* cited by examiner

BIASING FEATURES FOR A BATTERY MODULE

CROSS REFERENCE TO RELATED APPLICATIONS

This application claims priority from and the benefit of U.S. Provisional Application Ser. No. 62/100,001, entitled "MECHANICAL AND ELECTRICAL ASPECTS OF LITHIUM ION BATTERY MODULE WITH VERTICAL AND HORIZONTAL CONFIGURATIONS," filed Jan. 5, 2015, which is hereby incorporated by reference, in its entirety for all purposes.

BACKGROUND

The present disclosure relates generally to the field of batteries and battery modules. More specifically, the present disclosure relates to biasing features for a battery module.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Start-Stop" system similar to the mild hybrids, but the micro-hybrid systems may or may not supply power assist to the internal combustion engine and operate at a voltage below 60V. For the purposes of the present discussion, it should be noted that mHEVs typically do not technically use electric power provided directly to the crankshaft or transmission for any portion of the motive force of the vehicle, but an mHEV may still be considered an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery module. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles and other implementations. For example, it is now recognized that movement of unsecured battery cells in a battery module may result in degradation of the cells and their associated electrical connections, thereby reducing the reliability and/or lifetime of the battery module.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery module that includes a housing and a stack of battery cells disposed in a receptacle area of the housing, where each battery cell of the battery cell stack has a top having a battery cell terminal and a bottom opposite the top, and where the stack of battery cells is positioned such that the top of each battery cell faces outwardly away from the receptacle area. The battery module also includes an integrated sensing and bus bar subassembly positioned against the stack of battery cells and within the housing. The integrated sensing and bus bar subassembly includes a carrier, a bus bar integrated onto the carrier, and a biasing member integrated onto the carrier. The bus bar is configured to electrically couple battery cells of the stack of battery cells in an electrical arrangement. The biasing member is positioned between the top of each battery cell of the battery cell stack and the carrier, where the biasing member has a first material that is more compliant than a second material of the carrier, and the biasing member biases the stack of battery cells inwardly toward the housing.

The present disclosure also relates to a lithium-ion battery module that includes a housing and a stack of prismatic battery cells disposed in a receptacle area of the housing, each prismatic battery cell of the stack of prismatic battery cells has a top with a battery cell terminal and a bottom opposite the top, where the stack of prismatic battery cells is positioned such that the top of each prismatic battery cell faces outwardly away from the receptacle area. The battery module also includes a thermal transfer layer positioned adjacent to the bottom of the prismatic battery cells within the housing and configured to facilitate thermal transfer from the prismatic battery cells. The battery module has an integrated sensing and bus bar subassembly positioned against the stack of prismatic battery cells and within the housing. The integrated sensing and bus bar subassembly has a carrier, a bus bar integrated onto the carrier, a first biasing member integrated onto the carrier, and a second biasing member integrated onto the carrier. The bus bar is configured to electrically couple prismatic battery cells of the stack of prismatic battery cells in an electrical arrangement. The first and second biasing members are positioned between the top of each prismatic battery cell of the stack of prismatic battery cells and the carrier, where the first and second biasing members each have a strip having a first material more compliant than a second material of the carrier, the first and second biasing members bias the stack of battery cells inwardly toward the housing, and a cell vent of each prismatic battery cell of the stack of prismatic battery cells is positioned between the first and second biasing members.

The present disclosure further relates to an integrated sensing and bus bar subassembly for a lithium-ion battery module that includes a carrier, a bus bar integrated onto the carrier, a first biasing member integrated onto the carrier, and a second biasing member integrated onto the carrier. The bus bar is configured to electrically couple battery cells of a stack of battery cells in an electrical arrangement. The first and second biasing members are integrated onto the carrier via friction fits in which a first projection of the carrier is positioned within a first recess of the first biasing member and a second projection of the carrier is positioned within a second recess of the second biasing member, where the first and second biasing members are configured to be positioned between a top of each battery cell of the stack of battery cells and the carrier, the first and second biasing members each have a first material more compliant than a second material of the carrier, the first and second biasing members bias the stack of battery cells inwardly toward the housing, and a cell vent of each battery cell of the stack of battery cells is positioned between the first and second biasing members.

DRAWINGS

Various aspects of this disclosure may be better understood upon reading the following detailed description and upon reference to the drawings in which.

DETAILED DESCRIPTION

Figure 1:
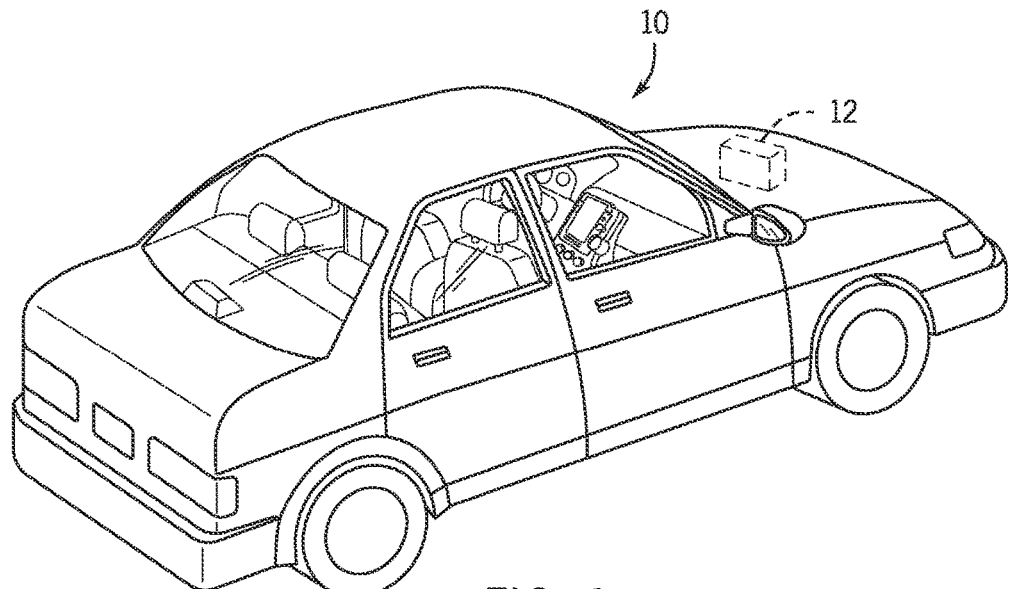
FIG. 1 is a perspective view of an xEV having a battery system configured to provide power for various components of the xEV, in accordance with an aspect of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One or more of the disclosed embodiments, alone or in combination, may be useful for reducing movement of battery cells within a battery module, thereby enhancing the structural integrity of the battery cells and their associated connections. For example, battery cells in a battery module, if not secured, may move during use of the battery module (e.g., as a result of movement of an xEV). Such movement may result in degradation of the cells and their associated electrical connections, reducing the reliability and/or lifetime of the battery module. In certain battery modules, such movement may be reduced using certain types of clamping mechanisms, namely those using actuatable compression mechanisms. However, it is now recognized that such mechanisms can add significant bulk and/or weight to the battery module, which reduces efficiency. Additionally, actuatable compression mechanisms may increase manufacturing costs of the battery module. It is now recognized that biasing members disposed on an integrated sensing and bus bar subassembly may be used to compress the battery cells inwardly toward the module housing, such as toward thermal transfer layers positioned within the housing. The compression may also enable enhanced thermal transfer between the battery cells and certain cooling features of the module housing, and may facilitate the use of passive cooling for the module instead of active cooling.

The present disclosure includes embodiments of a battery module having a compliant feature (e.g., biasing feature)

that interfaces with plastic ridges extending from a carrier disposed over tops of battery cells disposed in a housing of the module. For example, the compliant feature may press against the tops of the battery cells to bias the battery cells toward one or more thermal layers disposed between an interior surface of the housing and the battery cells. In accordance with an aspect of the present disclosure, each of the battery cells may be compressed in substantially equal fashion against the thermal layer via the compliant feature. The compression caused by the compliant features may act to substantially reduce movement and/or vibration of the battery cells within the module housing, thereby enhancing battery performance and/or lifetime.

To help illustrate, FIG. 1 is a perspective view of an embodiment of a vehicle 10, which may utilize a battery system 12 that includes compliant features that bias battery cells towards a bottom of a battery module housing, as described in the present disclosure. It is now recognized that it is desirable for the non-traditional battery system 12 (e.g., a lithium ion car battery including biasing features) to be largely compatible with traditional vehicle designs. In this respect, present embodiments include various types of battery modules for xEVs and systems that include xEVs. Accordingly, the battery system 12 may be placed in a location in the vehicle 10 that would have housed a traditional battery system (e.g., a standard 12V lead acid battery or a 12V lithium ion battery with no biasing features). For example, as illustrated, the vehicle 10 may include the battery system 12 positioned similarly to a lead-acid battery of a combustion-engine vehicle (e.g., under the hood of the vehicle 10).

Figure 2:
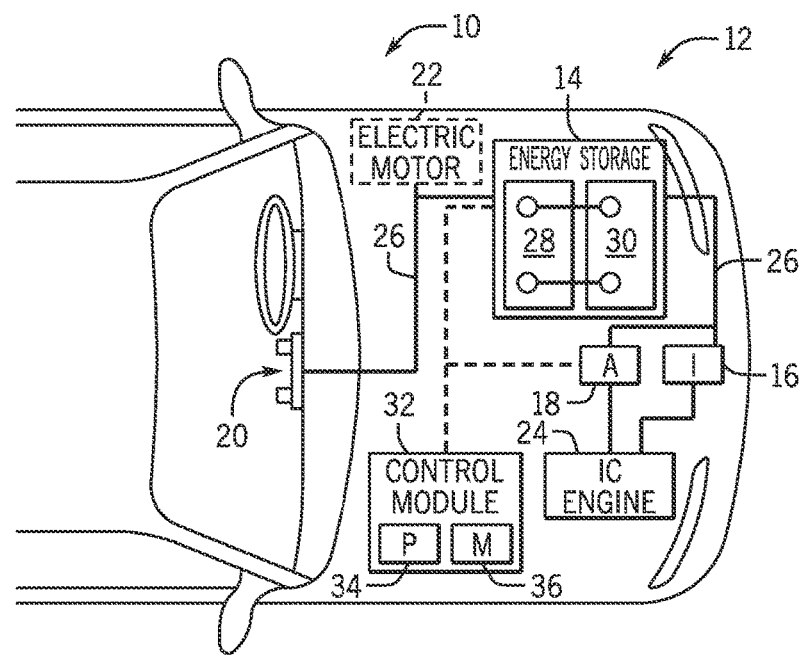
FIG. 2 is a cutaway schematic view of an embodiment of the xEV that utilizes the battery system of FIG. 1, in accordance with an aspect of the present disclosure.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical components in the vehicle 10. Additionally, the energy storage component 14 may output electrical energy to start (e.g., re-start or re-ignite) an internal combustion engine 24. For example, in a start-stop application, to preserve fuel, the internal combustion engine 24 may idle when the vehicle 10 stops. Thus, the energy storage component 14 may supply energy to re-start the internal combustion engine 24 when propulsion is demanded by the vehicle 10.

The battery system 12 may also supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. In the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally, or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator and/or the electric motor 22 are generally referred to herein as a regenerative braking system.

To facilitate capturing and supplying electrical energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20.

Additionally, as depicted, the energy storage component 14 may include multiple battery modules. For example, in the depicted embodiment, the energy storage component 14 includes a lithium ion (e.g., a first) battery module 28 and a lead acid (e.g., a second) battery module 30, which each includes one or more battery cells. Additionally, the energy storage component 14 may include any number of battery modules, all or some of which may include biasing features in accordance with the present disclosure. Although the lithium ion battery module 28 and lead-acid battery module 30 are depicted adjacent to one another, they may be positioned in different areas around the vehicle. For example, the lead-acid battery module 30 may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, when the lithium ion battery module 28 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32 (e.g., a battery management system). More specifically, the control module 32 may control operations of components in the battery system 12, such as relays (e.g., switches) within the energy storage component 14, the alternator 18, and/or the electric motor 22. For example, the control module 32 may regulate an amount of electrical energy captured/supplied by each battery module 28 or 30 (e.g., to de-rate and re-rate the battery system 12), perform load balancing between the battery modules 28 and 30, determine a state of charge of each battery module 28 or 30, determine a temperature or voltage of each battery module 28 or 30 (e.g., via a signal received from one or more sensing components), control voltage output by the alternator 18 and/or the electric motor 22, and the like.

Accordingly, the control unit 32 may include one or more processor units 34 and one or more memory components 36. More specifically, the one or more processor units 34 may include one or more application specific integrated circuits (ASICs), one or more field programmable gate arrays (FPGAs), one or more general purpose processors, or any combination thereof. Additionally, the one or more memory components 36 may include volatile memory, such as random access memory (RAM), and/or non-volatile memory, such as read-only memory (ROM), optical drives, hard disc drives, or solid-state drives. In some embodiments, the control unit 32 may include portions of a vehicle control unit (VCU) and/or a separate battery control module. Furthermore, as depicted, the lithium ion battery module 28 and the lead-acid battery module 30 are connected in parallel across their terminals. In other words, the lithium ion battery module 28 and the lead-acid battery module 30 may be coupled in parallel to the vehicle's electrical system via the bus 26.

To enhance the stability of the lithium ion battery module 28, present embodiments, as discussed above, utilize one or more compliant (e.g., biasing) features to interface with plastic projections extending from a carrier to exert a biasing force against battery cells within a housing of the module 28. Each compliant (e.g., biasing) feature may, for example, press against the tops of certain of the battery cells to bias the battery cells toward one or more thermal layers disposed proximate to bottoms of the battery cells, opposite the tops of the battery cells. The tops and bottoms of the battery cells will be further appreciated with reference to FIG. 4. In accordance with an aspect of the present disclosure, each of the battery cells may be compressed in substantially equal fashion against the thermal layer regardless of height (e.g., measured bottom to top). Present embodiments may be further appreciated with reference to the battery module 28 in FIG. 3, which is a lithium ion battery module 28. However, the lithium ion battery module 28 is intended to represent any battery module configuration that may benefit from the present techniques.

As shown in the illustrated embodiment, lithium ion battery modules 28 in accordance with the present disclosure may include a plurality of battery cells 50. The battery cells 50 may be arranged in a first stack 52 and a second stack 54, where the battery cells 50 are positioned adjacent one another in orientations where their respective terminals 56 are positioned at the same side of the stacks 52, 54. Accordingly, adjacent battery cells 50 will have terminals 56 that are adjacent to one another in each of the first and second stacks 52 and 54. As an example, the embodiment of FIG. 3 includes the first and second stacks 52, 54 in a side-by-side relationship. In other embodiments, the first and second stacks 52, 54 may be configured in another orientation (e.g., a top to bottom relationship). In still further embodiments, only one cell stack may be included in the battery module 28, or more than two cell stacks may be included (e.g., 3, 4, 5, 6, 7, 8, 9, 10, or more cell stacks). As also shown, the plurality of battery cells 50 are positioned in the module 28 in a face-to-face stacked arrangement, but other configurations may be utilized.

Figure 3:
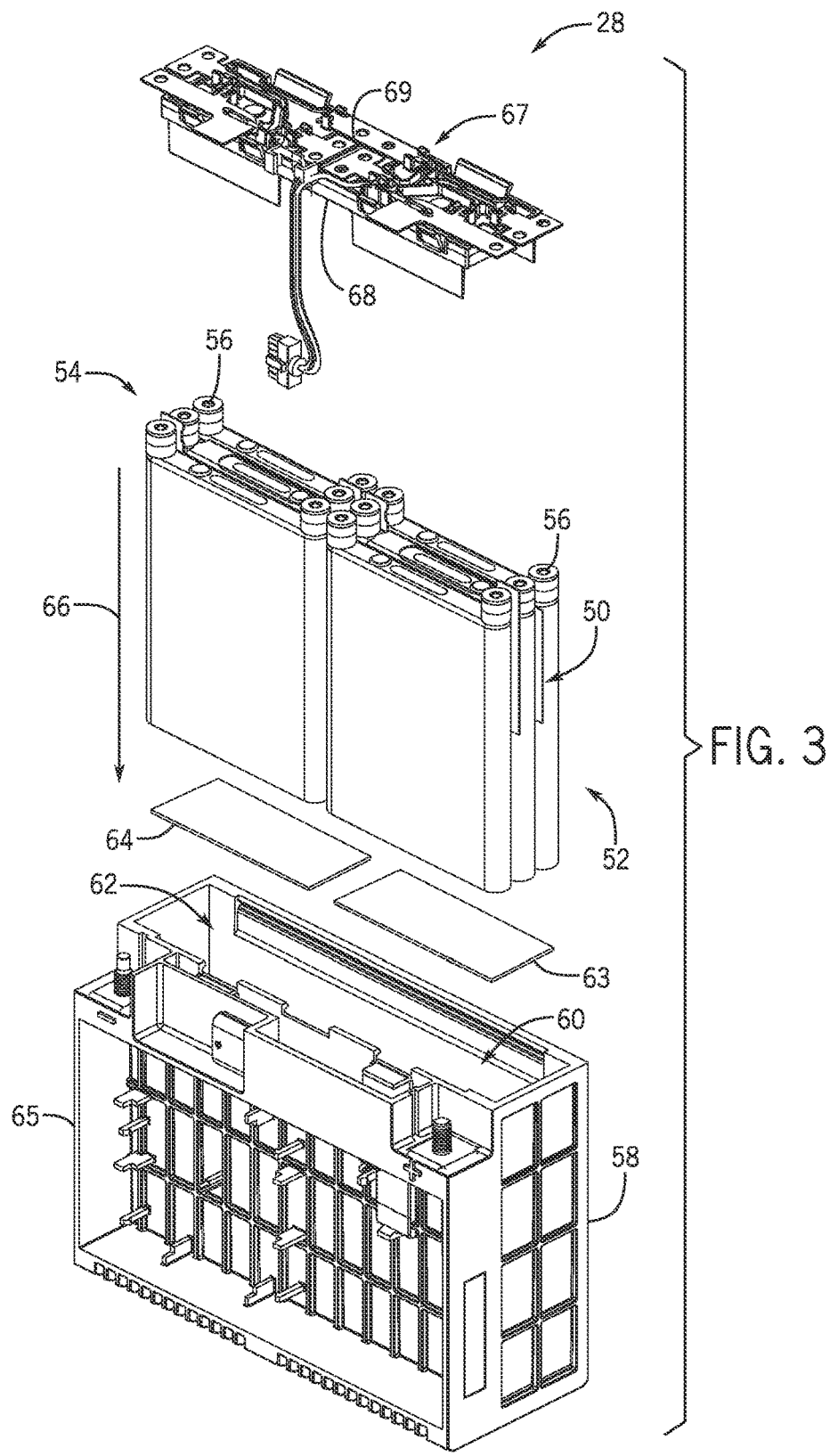
FIG. 3 is an exploded view of a lithium ion battery module having compliant features and thermal transfer layers, in accordance with an aspect of the present disclosure.

As shown in FIG. 3, the battery module 28 may include a module housing 58 constructed of any appropriate material, such as an amide-based polymer, a polyolefin (e.g., polypropylene), or any other material. The module housing 58 includes a cell receptacle region 60, where the battery cell stacks 52 and 54 are positioned within the battery module housing 58. In the illustrated embodiment, the battery cells 50 are positioned into the cell receptacle region 60 "bottom first," where the terminals 56 of each battery cell 50 point outwardly toward an opening 62 of the receptacle region 60. As shown in the illustrated embodiment, a first thermal transfer layer 63 and a second thermal transfer layer 64, which may be made of compliant and thermally conductive materials, may be positioned between bottoms of the battery cells 50 in the battery cell stacks 52 and 54, respectively. Accordingly, the first and second thermal transfer layers 63, 64 may be positioned adjacent to an interior surface of the battery module housing 58. In other embodiments, the battery module 28 may include only one thermal transfer layer configured to be positioned between the bottoms of the battery cells 50 of both battery cell stacks 52 and 54. The thermal transfer layers 63, 64 may facilitate a transfer of thermal energy from the bottoms of the cells 50 to thermal management features of the battery module 28, such as a heat sink, heat fins, etc. Such thermal management features may be positioned on an exterior surface 65 of the housing. Additionally, the thermal transfer layers 63, 64 may also reduce movement of the battery cells 50 by acting as a shock absorber. For example, the thermal transfer layers 63, 64 may include a compliant material that expands and compresses with movement of the battery module 28 such that the battery cells 50 remain substantially stationary.

The presently disclosed battery module 28 may include features configured to bias the battery cells 50 in a direction 66 while positioned within the module housing 58. In FIG. 3, this is depicted as the biasing direction 66. In certain embodiments, the biasing direction 66 may extend from the tops of the battery cells 50 to bottoms of the battery cells 50 while positioned within the module housing 58. Thus, the biasing features may bias the battery cells 50 toward the thermal transfer layers 63 and 64, thereby facilitating thermal transfer during operation of the battery module 28. In addition, the biasing members may, in combination with the thermal transfer layers 63, 64 (e.g., layers having a compliant material), provide a degree of shock absorption to reduce the effect of vibrations on the structural integrity of the battery cells 50 and their associated electrical connections.

Additionally, the battery module 28 may include an integrated sensing and bus bar subassembly 67. The integrated sensing and bus bar subassembly may include a first side 68 and a second side 69, opposite the first side 68. The first side 68 may face the tops of the battery cells 50, and the second side 69 may face outwardly toward the opening 62. Compliant features, in accordance with the present disclosure, may be included on the integrated sensing and bus bar subassembly 67 to bias the battery cells 50 in the biasing direction 66.

Figure 4:
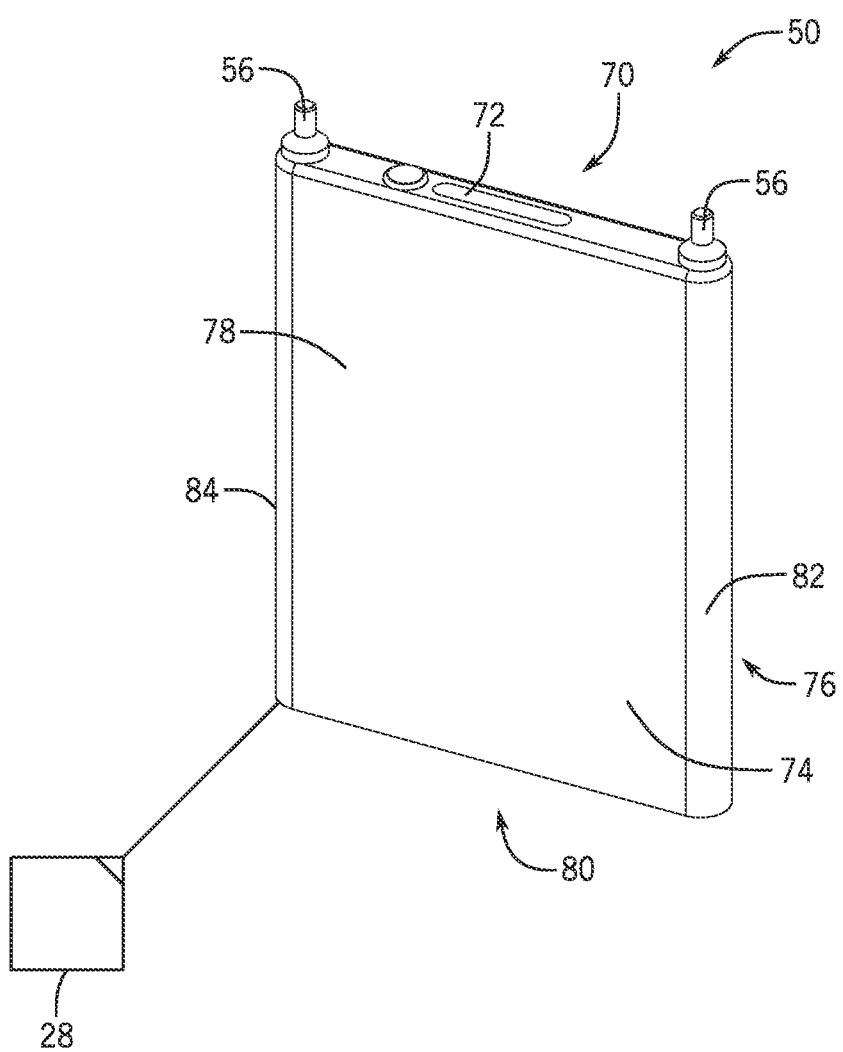
FIG. 4 is an illustration of a battery cell that may be biased by one or more compliant features, in accordance with an aspect of the present disclosure.

To facilitate discussion of the present embodiments, FIG. 4 illustrates a battery cell 50 that may be biased using one or more of the compliant (e.g., biasing) features, in accordance with aspects of the present disclosure. In a prismatic cell configuration, as shown in FIG. 4, the battery cells 50 include a top portion 70 having at least one cell terminal 56 (the illustrated embodiment has two cell terminals 56 on the top portion 70) and a cell vent 72 for allowing pressurized gas to escape during a venting situation.

The illustrated battery cell of FIG. 4 also includes a first face 74 and a second face 76, corresponding to the broadest part of a casing 78 of the battery cells 50. A bottom portion 80 is substantially opposite the top portion 70, and may, in some embodiments, include a cell vent in lieu of the cell vent 72 on the top portion 70. The faces 74 and 76 extend between the top and bottom portions 70, 80, and are coupled by a first side 82 and a second side 84, which may be straight, rounded, or any other suitable geometry. The casing 78 (e.g., housing) of the battery cell 50, which houses the active electrochemical elements of the cell 50, may be polymeric, metallic, composite, or any other suitable material. Further, it should be noted that the present embodiments are not limited to battery modules having prismatic battery cells, but are also intended to include embodiments where the battery cells 50 are pouch battery cells, cylindrical battery cells, and so forth. Furthermore, while described in the context of a lithium ion battery module having lithium ion battery cells, the present disclosure is applicable to other battery chemistries that may benefit from the biasing disclosed herein.

Certain components of the integrated sensing and bus bar subassembly 67 (also referred to as a "carrier assembly" herein), as shown in FIG. 3, interface with the battery cells 50. As shown in FIG. 3, the integrated sensing and bus bar subassembly 67 may be positioned adjacent to the top portions 70 of the battery cells 50, which enables the subassembly 67 to electrically interconnect the battery cells 50 in a predetermined relationship using bus bars 90 integrated onto the subassembly 67. The interconnection of the battery cells 50 by, for example, welding the bus bars 90 to features of the battery cells 50, may enable a plurality of series and/or parallel connections to be made, resulting in a predetermined voltage and/or capacity of the overall battery module 28. In certain embodiments (e.g., the embodiment illustrated in FIG. 3), the battery module 28 may have, for example, six battery cells 50 connected in series to produce a voltage output that is the sum of the individual voltages of the battery cells 50, and a capacity substantially equal to the capacity of an individual cell 50. Other electrical connections, such as one or more parallel connections, would affect the voltage and capacity. In other embodiments, the battery module 28 may include less than six battery cells (e.g., 5, 4, 3, 2, or 1) or more than six battery cells (e.g., 7, 8, 9, 10, 12, 15, 20, 25, 30, 35, 40, 45, 50, or more).

Figure 5:
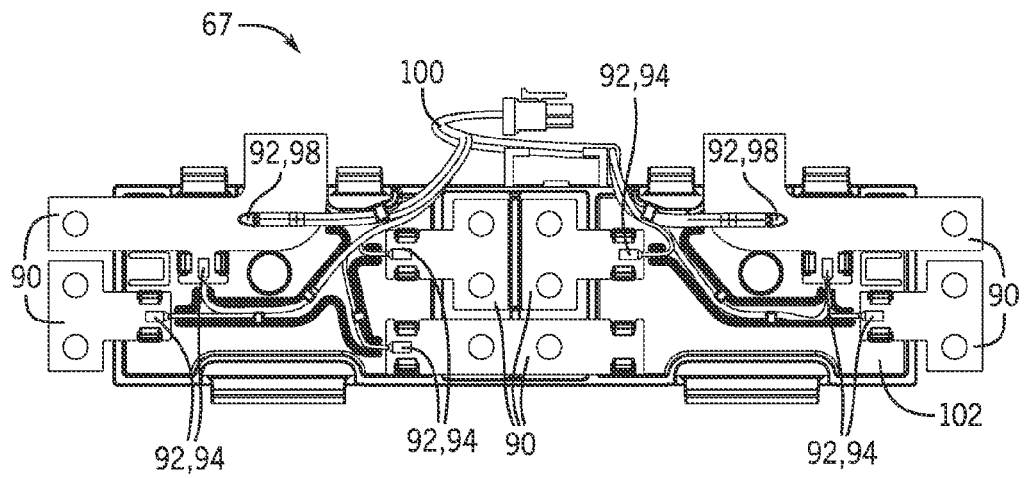
FIG. 5 is an illustration of an integrated sensing and bus bar subassembly of the battery module of FIG. 3 with compliant features, in accordance with an aspect of the present disclosure.
Figure 6:
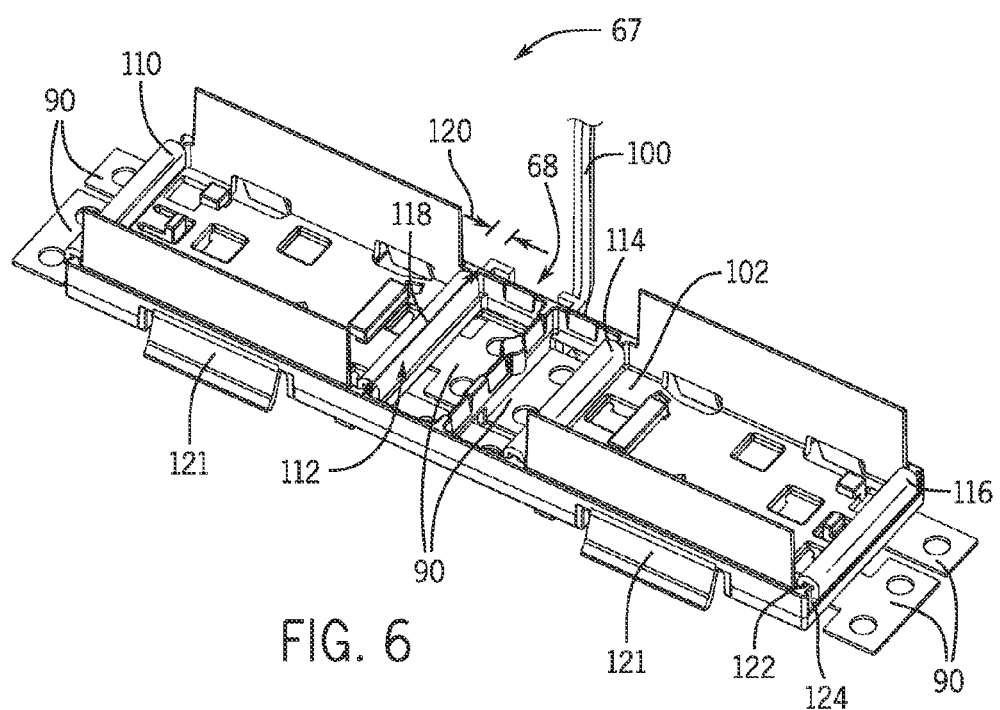
FIG. 6 is a back perspective view of the compliant features coupled to the integrated sensing and bus bar subassembly of FIG. 5, in accordance with an aspect of the present disclosure.

In addition to the bus bars 90 that interconnect the battery cells 50, the integrated sensing and bus bar subassembly 67 may include a number of different features 92 for monitoring conditions in the battery module 28. FIG. 5 illustrates the subassembly 67 having sensing features 92 (e.g., sensing components, sensors), which may include voltage sense components 94 configured to sense voltages at bus bars 90, as well as temperature sense components 98 configured to sense temperatures at the bus bar 90. These sensing components 92 are coupled to cabling 100 configured to carry signals generated by the sensing components 92 to the control unit 32 (e.g., the BMS) shown in FIG. 2. For example, the sensing features 92 may be electrically coupled to the control unit 32 (e.g., via the cabling 100) and configured to send signals (e.g., feedback) pertaining to a temperature or a voltage of the battery module 28 over time. In certain embodiments, the bus bars 90, the temperature sense components 98 and voltage sense components 94, and the cabling 100 are all integrated onto a carrier 102, which may form a one-piece structure (e.g., the subassembly) configured to carry and integrate these components. In accordance with present embodiments, the carrier 102 may include the biasing features described above. For instance, while the second side 69 of the subassembly 67 is shown in FIG. 5, the first side 68, opposite the second side 69, faces the battery cells 50 and may include the biasing features An embodiment of the integrated sensing and bus bar subassembly 67 including an example set of biasing members 110 and 112 is shown in FIG. 6. Specifically, the embodiment of the subassembly 67 depicted in FIG. 6 is shown from a back perspective view, and depicts the first side 68 of the carrier assembly 67 that faces toward the battery cells 50 upon assembly. The illustrated embodiment of the assembly 67 includes first 110 and second 112 biasing members, which, upon assembly of the battery module 28, press against the top portions 70 of the battery cells 50 in the battery cell stack 52. The first and second biasing members 110 and/or 112 may be located within the carrier assembly 67 in positions corresponding to either side of the vents 72 of the battery cells 50, as well as other cell features (e.g., fill holes). In this way, the first and second biasing members 110 and/or 112 do not affect (e.g., physically interfere with) vent deployment. In accordance with present embodiments, the location of the first and second biasing members 110 and/or 112 may be different depending on, for example, the geometry and location of the vents 72 on the battery cells 50. A third biasing member 114 and a fourth biasing member 116 may have a similar relationship with the second battery cell stack 54.

The biasing features 110, 112, 114, and/or 116 may be configured to bias the battery cells 50 in the biasing direction 66. In certain embodiments, the biasing direction 66 may extend from the respective top portions 70 of the battery cells 50 to the respective bottom portions 80 while positioned within the module housing 58. For example, the biasing features 110, 112, 114, and/or 116 included on the integrated sensing and bus bar subassembly 67 bias the bottoms 80 of the battery cells 50 toward the thermal transfer layers 63, 64, thereby facilitating thermal transfer during operation of the battery module 28. In addition, the biasing members 110, 112, 114, and/or 116 may, in combination with the thermal transfer layers 63, 64 (e.g., thermal layers including compliant material), provide a degree of shock absorption to reduce the effect of vibrations on the structural integrity of the battery cells 50 and their associated electrical connections. In other embodiments, the biasing direction 66 may extend from the respective bottom portions 80 of the battery cells 50 to the respective top portions 70 of the battery cells 50.

Because the operation of the battery cells 50 is dependent on a number of factors, including compression placed on the cell 50, cell temperatures, and so forth, it may be desirable to place a substantially equal amount of bias to each battery cell 50 within the battery cell stacks 52 and 54. Accordingly, the biasing members 110, 112, 114, and/or 116 may have a length 118 that is sufficient to extend along all of the battery cells 50 in the battery cell stack 52 and/or 54. The width of the biasing members 120 may be dependent on the available space on the top portions 70 of the battery cells 50 for abutment, the number of biasing members used on the battery cells 50, and similar considerations.

The biasing force placed upon the battery cells 50 by the biasing members 110, 112, 114, and/or 116 may be dependent on a number of factors, including the material composition of the biasing members 110, 112, 114, and/or 116, the material composition of the casings 58 of the battery cells 50, the material composition of the compliant thermal transfer layers 63, 64, the amount of compression applied by the carrier assembly 67 when the module 28 is assembled (e.g., compression force applied to the battery cells 50 via biasing members 110, 112, 114, and/or 116), the size of the battery cells 50, and so forth. For example, during assembly, the carrier 102 may be secured to the module housing 58 (e.g., using module interface members 121 such as cantilevered hooks, using adhesives, using laser welding, or similar methods) and apply a compression force to the battery cells 50.

In view of the configuration shown in FIG. 3, it should be noted that the total force (e.g., from the carrier 102, the biasing members 110, 112, 114, 116, and other components) applied to the battery cell casing 58 may be highly dependent on the material construction of the various features (e.g., biasing members, compliant thermal transfer layers) in physical contact with the battery cell 50, as well as the size of the battery cells 50. In certain embodiments, the biasing members 110, 112, 114, and/or 116 may account for variations in the height (e.g., from the bottom to top) between the battery cells 50. For example, the biasing members 110, 112, 114, and/or 116 may apply unequal biasing forces (e.g., compression forces) to battery cells 50 having different heights. The biasing members 110, 112, 114, and/or 116 may place a greater biasing force on taller battery cells (e.g., from bottom to top) and a lesser biasing force on shorter battery cells because the taller battery cells may be closer to the biasing members 110, 112, 114, and/or 116 than the shorter battery cells, for example. Accordingly, the battery cells 50 may be substantially aligned as a result of the varying forces applied by the biasing members 110, 112, 114, and/or 116, which may facilitate connection to the carrier assembly 67 (e.g., via the bus bars 90).

Furthermore, assuming that only the material composition of the biasing members 110, 112, 114, and/or 116 is changed, the compliance of the biasing members 110, 112, 114, and/or 116 may be varied to adjust the amount of biasing force placed upon an individual battery cell 50. Indeed, the compliance of the biasing members 110, 112, 114, and/or 116 may be selected based on a balance between the desired biasing force and the physical stress placed upon the battery cell casing 58 by the biasing members 110, 112, 114, and/or 116. For instance, the physical stress, if too great, may compromise the structural integrity of the casing 58, while the compliance, if too great, may not provide a desired amount of shock absorbance and physical restraint. Accordingly, the Shore A hardness of the biasing members 110, 112, 114, and/or 116 may be selected from a range of values, which by way of non-limiting example, may include a Shore A hardness value between 20 and 80, for example between 40 and 60. Such values may enable a desired degree of compliance while still providing sufficient physical restraint to maintain the positioning of the batter cells 50 in their respective positions. In certain embodiments, the material forming the biasing members 110, 112, 114, and/or 116 may be more compliant (e.g., include a smaller Shore A hardness value) than the material of the carrier 78. Accordingly, the biasing members 110, 112, 114, and/or 116 may exhibit resiliency (e.g., compress when applying a biasing force on the battery cells 50 and decompress to an original position when the biasing force is removed), whereas the carrier 78 remains substantially rigid.

In certain embodiments, the hardness of the biasing members 110, 112, 114, and/or 116 may be selected to enable the biasing members 110, 112, 114, and/or 116 to also serve as a weather strip. Therefore, the biasing members 110, 112, 114, and/or 116 may be configured to not only bias the battery cells and absorb vibrational forces, but may also be configured to block the egress of moisture, vented gases, or the like, from the cell vents 72 to other areas of the battery module 28. For example, the sensing features 92 included on the integrated sensing and bus bar subassembly 67 may be sensitive to high temperatures, which may be created by gases vented from the battery cells 50. Therefore, in certain embodiments, the biasing members 110, 112, 114, and/or 116 may be configured to block such gases from contacting, and potentially damaging, the sensing components 92, thereby enhancing the life of the battery module 28. In certain embodiments, the biasing members 110, 112, 114, and/or 116 may direct the vented gases toward a specific vent path, thereby preventing contact with any sensitive electronic components (e.g., the sensing features 92) that may be damaged by the gases.

By way of non-limiting example, the biasing members 110, 112, 114, and/or 116 may be formed from or otherwise include one or more polymeric compounds, and, in certain embodiments, may include one or more filler materials. For example, the biasing members 110, 112, 114, and/or 116 may include any one or a combination of an elastomer (e.g., polybutadiene), a polyolefin (e.g., polypropylene, polyethylene), a mixture of an elastomer and another polymer, such as a polyolefin or polyarene (e.g., a mixture of polybutadiene and polystyrene, such as a high-impact polystyrene (HIPS) resin), a polyester (e.g., which may provide chemical and stress crack resistance), and so forth. Fillers of the biasing members 110, 112, 114, and/or 116 may include fillers that provide structural reinforcement and/or chemical resistance, such as fibers, particulates, and similar filler materials. The filler material may be carbon-based, metallic, ceramic, silica-based glass, borosilicate glass, or any other suitable filler material.

The material properties of the biasing members 110, 112, 114, and/or 116 may also enable the biasing members 110, 112, 114, and/or 116 to be retained on the carrier 102 without the use of adhesives or other securement mechanisms. However, the present disclosure also encompasses embodiments where the biasing members 110, 112, 114, and/or 116 are secured to the carrier 102 using adhesives, tie-downs, over-molding, and so forth. In accordance with the embodiment illustrated in FIG. 6, the biasing members 110, 112, 114, and/or 116 may be secured using a friction or interference fit, where the biasing members 110, 112, 114, and/or 116 include a recess 122 configured to receive a projection 124 of the carrier 102.

Figure 7:
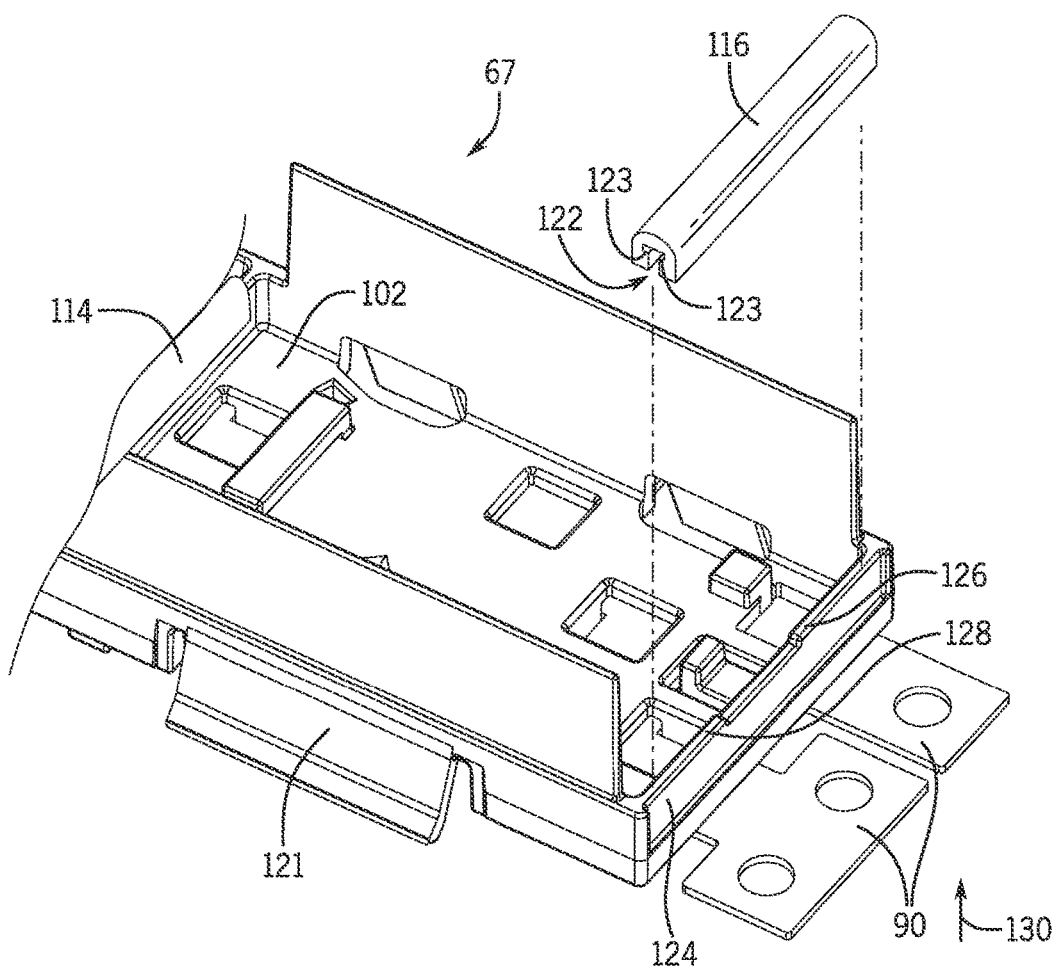
FIG. 7 is an illustration of an interface for coupling the compliant features to the integrated sensing and bus bar subassembly of FIG. 5, in accordance with an aspect of the present disclosure.

FIG. 7 depicts an expanded view of FIG. 6, with the fourth biasing member 116 removed from the carrier 102. As shown, the carrier 102 includes an interface 126 for the fourth biasing member 116, which includes the projection 124. The illustrated projection 124 includes a lipped edge 128, which may facilitate retention of the biasing member 116 on the carrier 102 by providing additional surfaces oriented crosswise (e.g., perpendicular) to a direction 130 where the biasing member 116 would be pulled away from the carrier 102. The recess 122 may include indentations 123 configured to conform to and receive the lipped edge 128, thereby securing the protrusion 124 in the recess 122. Therefore, when the projection 124 is received in the recess 122, the lipped edge 128 may enable the biasing member 116 to resist inadvertent removal from the interface 126. Moreover, the interface 126 may enable simpler and more convenient assembly of the module 28 because the recess 122 of the biasing member 116 may simply be inserted over the projection 124 to secure the biasing member 116 to the carrier 102.

Figure 8:
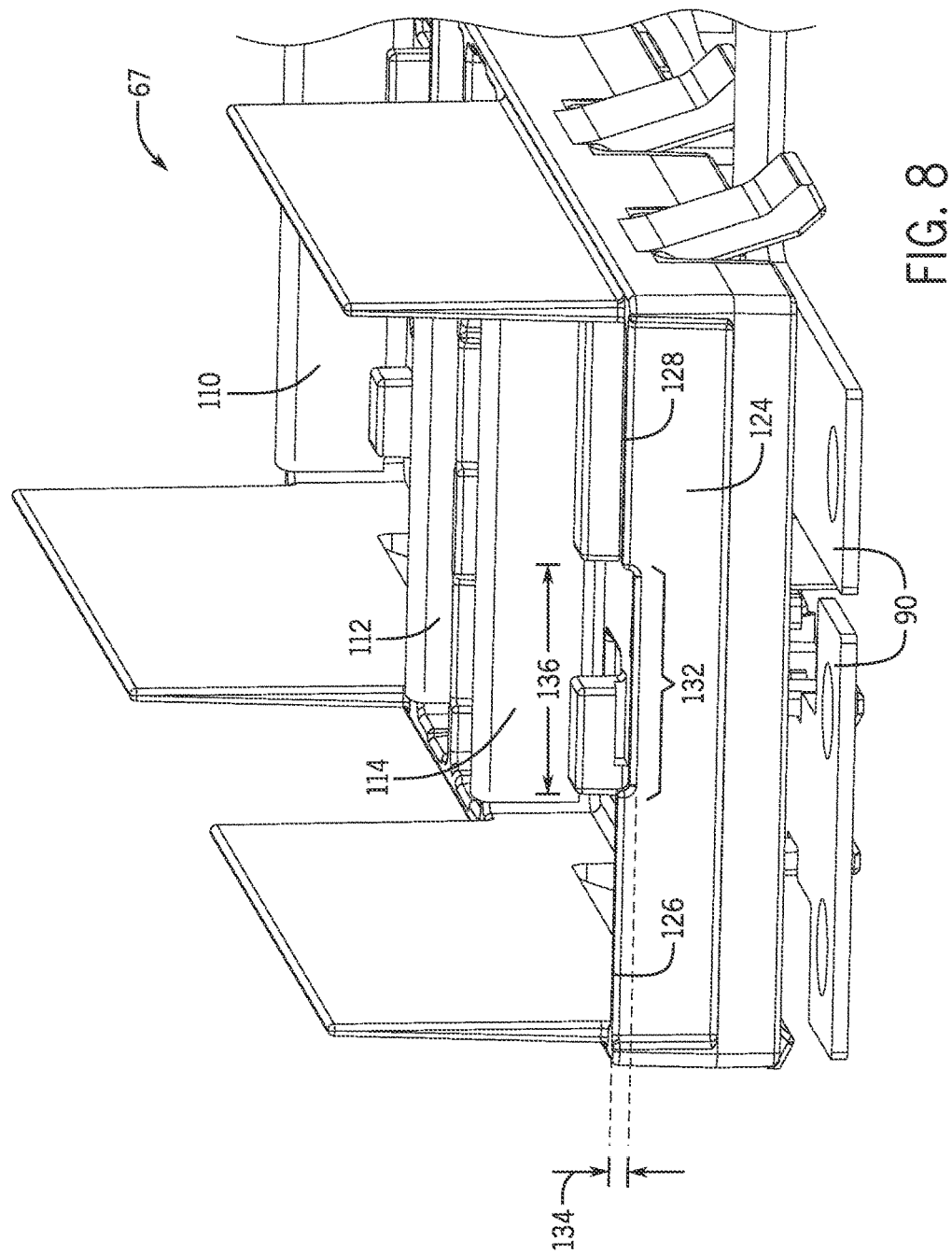
FIG. 8 is an illustration of a cutaway portion of the integrated sensing and bus bar subassembly of FIG. 7 for a battery cell having a battery cell sleeve, in accordance with an aspect of the present disclosure.

Additionally, the interface 126 may include a cutaway portion 132, as illustrated in FIG. 8. For example, the cutaway portion 132 may enable the biasing members 110, 112, 114, and/or 116 to have additional conformance to certain features protruding from the battery cell. For example, certain battery cells may be covered with a battery cell sleeve such that these battery cells require additional space relative to those without such sleeves. The additional compliance provided by the cutaway portion 132 in conjunction with the material composition of the biasing members 110, 112, 114, and/or 116, may enable the biasing members 110, 112, 114, and/or 116 to apply substantially the same biasing force to all of the battery cells 50, regardless of battery cell height (e.g., from bottom to top) and whether the battery cells 50 include a battery cell sleeve (e.g., middle battery cells in FIG. 3 include a battery cell sleeve). The battery cell sleeve or other such projections may be positioned over the battery cell casing 58 causing the battery cell 50 to incur an increased height and width. For example, one battery cell of the battery cells 50 that includes a battery cell sleeve may be taller than the remaining battery cells 50. Therefore, the cutaway portion 132 enables the interface 126 to conform to the increased height, such that a force applied to the battery cell with the battery cell sleeve does not cause damage to the casing 58. In certain embodiments, the cutaway portion 132 has a depth 134 corresponding to the increased height of the battery cell sleeve (e.g., the difference between a battery cell with a battery cell sleeve and a battery cell without a battery cell sleeve). Additionally, the cutaway portion 132 may include a width 136 that corresponds to the overall thickness of the battery cell 50 when the battery cell sleeve is placed over the battery cell 50 (e.g., the combined thickness of the battery cell casing 78 and the battery cell sleeve).

Figure 9:
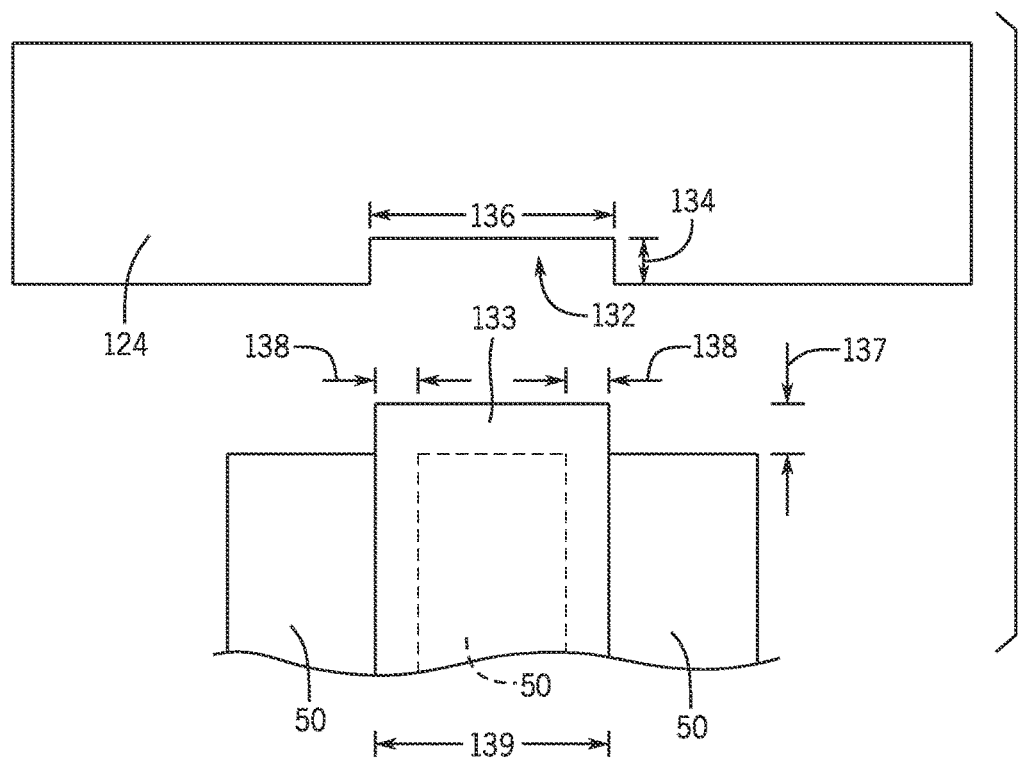
FIG. 9 is an illustration of an expanded view of the cutaway portion of FIG. 8 and a battery cell having a battery cell having the battery cell sleeve, in accordance with an aspect of the present disclosure.

FIG. 9 illustrates an expanded view of the cutaway portion 132 as well as a battery cell 50 having the battery cell sleeve 133. As shown in the illustrated embodiment, the battery cell sleeve 133 causes the battery cell 50 to incur an increased height 137 and an increased width 138 in comparison to the battery cells 50 without the battery cell sleeve 133 (e.g., the battery cells 50 to the right and to the left of the battery cell 50 with the sleeve 133). Therefore, the depth 134 of the cutaway portion 132 may correspond to the increased height 137, and the width 136 of the cutaway portion 132 may correspond to a total width 139 of the battery cell 50 having the battery cell sleeve 133 so that the biasing members 110, 112, 114, and/or 116 may have additional conformance to the battery cell 50 having the battery cell sleeve 133.

Figure 10:
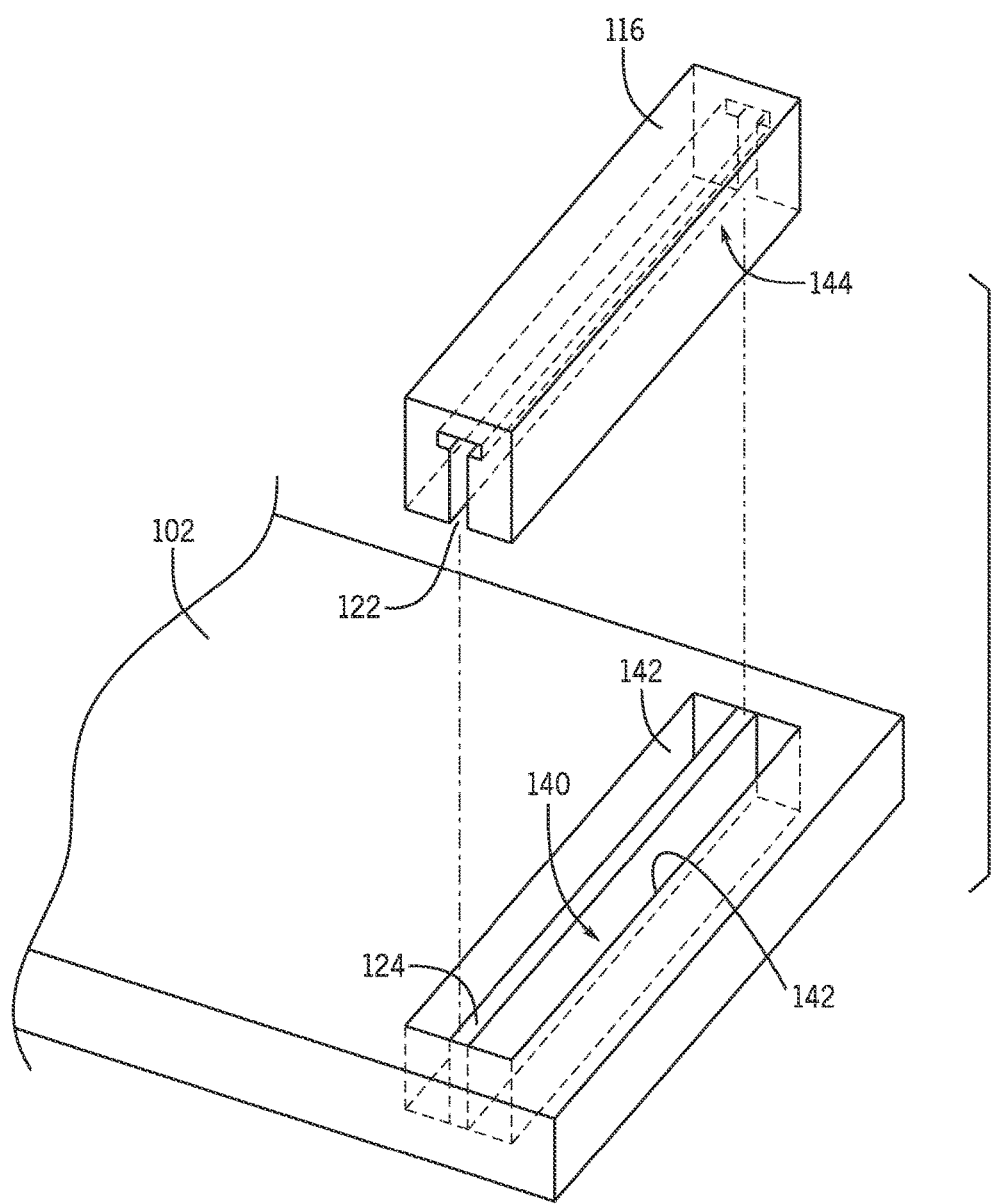
FIG. 10 is an illustration of another embodiment of an interface for coupling the compliant features to the integrated sensing and bus bar subassembly of FIG. 5 in accordance with an aspect of the present disclosure.

Embodiments of the integrated sensing and bus bar subassembly 67 may include channels 140 (e.g., notches, indentations) having walls 142 and configured to receive portions of one or more of the biasing members 110, 112, 114, and/or 116, as shown in FIG. 10. The biasing members 110, 112, 114, and/or 116 may be secured in the channels 140 via a friction fit, using adhesives, or a combination thereof. In such embodiments, the biasing members 110, 112, 114, and/or 116 may be retained within the channels 140 using, for instance, friction between an outermost surface 144 of the biasing member 116 and the walls 142 of the channel 140. Accordingly, the biasing member 116 is secured into the channel 140 in a manner that resists inadvertent removal. In certain embodiments, only a portion of the biasing member 110, 112, 114, and/or 116 is inserted into the channel 140 such that a second portion protrudes from the channel 140, such that the biasing member 110, 112, 114, and/or 116 may apply the biasing force to the battery cells 50.

Further, the channels 140 may also include the protrusions 124 to enable an interference fit between the recess 122 in the biasing member 110, 112, 114, and/or 116 and the protrusions 124, so that the biasing members 110, 112, 114, and/or 116 are each retained on the carrier 102 using two securement mechanisms (e.g., the friction between the channel surface and the outermost surface of a biasing member and friction between the biasing member recess and a surface of the projection and/or the lipped edge). In embodiments employing the channels 140, the depth of the channels 140 may depend on the size of the biasing members 110, 112, 114, and/or 116, as well as the biasing force to be applied to the battery cells 50. For example, the channels 140 may be relatively shallow when a large biasing force is desired. Conversely, the channels 140 may be deeper when a smaller biasing force is desired.

Figure 11:
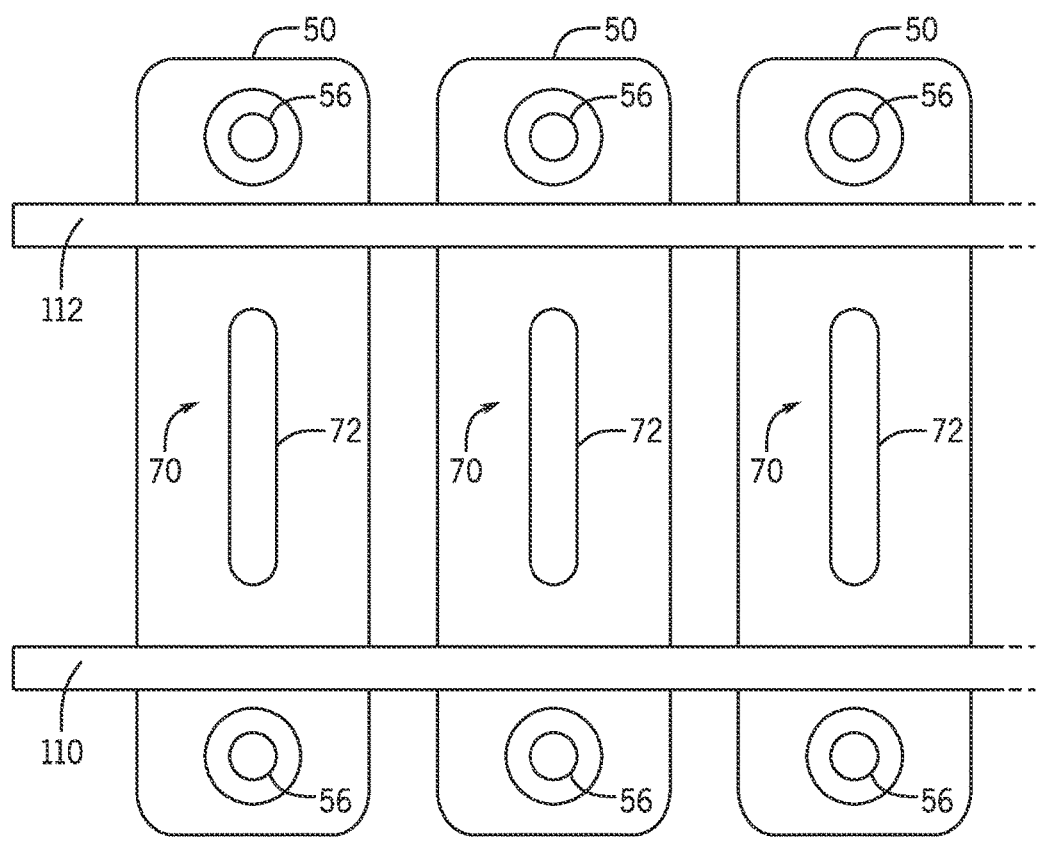
FIG. 11 is an illustration of a top view of the compliant features disposed on tops of battery cells, in accordance with an aspect of the present disclosure.

When the biasing members 110, 112, 114, and/or 116 are secured onto the carrier 102, the biasing members 110, 112, 114, and/or 116 may apply a biasing force to the battery cells 50 to reduce movement of the battery cells 50 in the battery module 28. FIG. 11 illustrates a top view of the biasing members 110 and 112 disposed on the top portions 70 of the battery cells 50. As shown in the illustrated embodiment, the biasing members 110 and 112 are positioned, such that the cell vent 72 is between the biasing members 110 and 112. Therefore, the biasing members 110 and 112 do not affect (e.g., physically interfere with) vent deployment. In certain embodiments, the biasing members 110 and 112 may be positioned between the cell terminals 56. In other embodiments, the biasing members 110 and 112 may be positioned, such that the cell terminals 56 are between the biasing members 110 and 112. In still further embodiments, the biasing members 110 and 112 may be positioned, such that one of the cell terminals 56 is between the biasing members 110 and 112.

Figure 12:
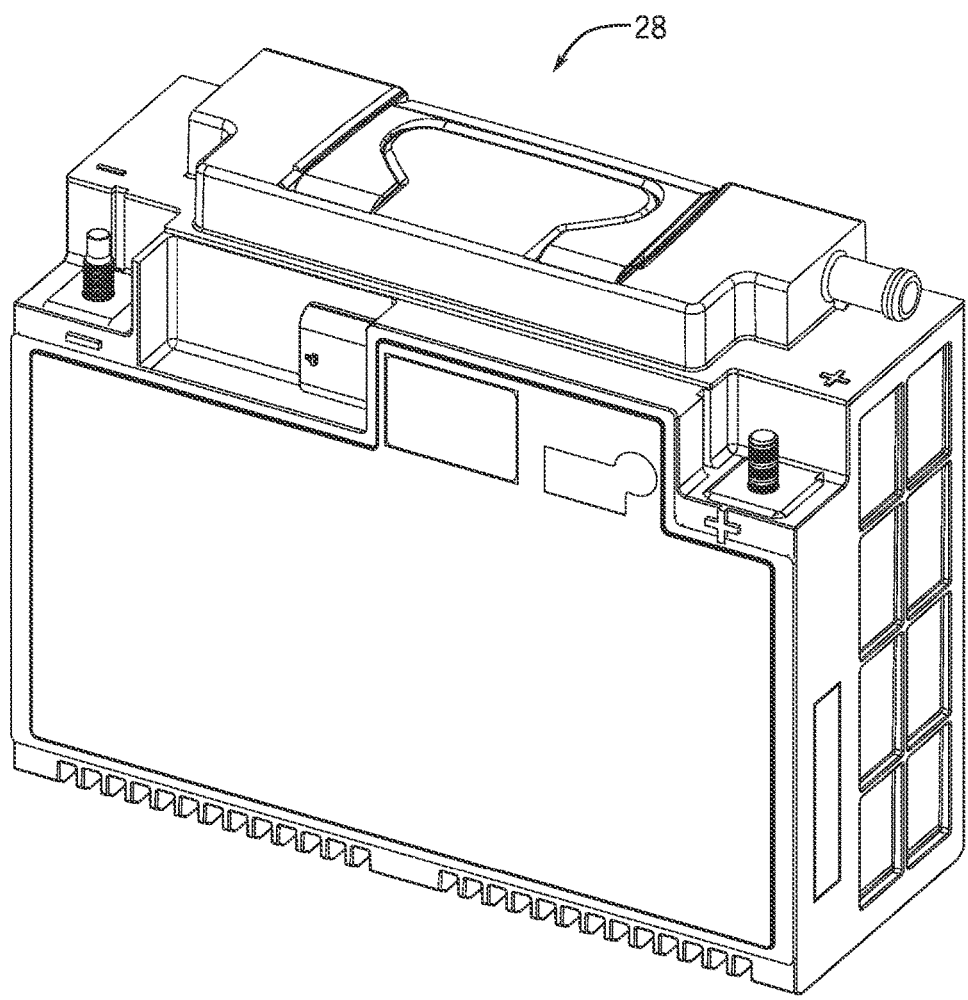
FIG. 12 is a perspective view of a fully assembled battery module that includes compliant features, in accordance with an aspect of the present disclosure.

In accordance with one aspect of the present disclosure, the biasing members 110, 112, 114, and/or 116, in combination with the integrated sensing and bus bar subassembly 67, may provide a degree of compression sufficient to reduce or altogether eliminate the need for additional compression mechanisms. Such additional compression mechanisms would typically include actuatable compression mechanisms, such as those using threaded connections, cranking mechanisms, moving compression plates, and so forth. Such additional compression mechanisms may be expensive and difficult to implement into the battery module 28. In contrast, battery modules in accordance with certain embodiments of the present disclosure may only utilize compression provided by the carrier 102, the biasing members 110, 112, 114, and/or 116, and the swelling of the battery cells 50 during operation. An embodiment of a fully assembled version of the battery module 28 having the biasing features of the present disclosure is shown in FIG. 12. It should be appreciated that the battery module 28, when substantially assembled as shown, does not include an actuatable compression mechanism.

In view of the foregoing, it should be appreciated that one or more of the disclosed embodiments, alone or in combination, may be useful for providing the technical effect of reducing movement of battery cells within a battery module, thereby enhancing the structural integrity of the battery cells and their associated connections. For example, in one aspect, it is now recognized that battery cells in a battery module, if not secured using an actuatable compression mechanism, may move during use of the battery module. It is also now recognized that such movement may result in degradation of the cells and their associated electrical connections, reducing the reliability and/or lifetime of the battery module. To mitigate these unwanted effects and to provide other advantages and technical effects, the present disclosure uses biasing members positioned on an integrated sensing and bus bar subassembly to bias the battery cells inwardly toward the module housing, such as toward thermal transfer layers positioned within the housing. The biasing may also enable enhanced thermal transfer between the battery cells and certain cooling features of the module housing, and may facilitate the use of passive cooling for the module instead of active cooling. The technical effects and technical problems in the specification are exemplary and are not limiting. It should be noted that the embodiments described in the specification may have other technical effects and can solve other technical problems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A battery module, comprising:
a housing;
a stack of battery cells disposed in a receptacle area of the housing, each battery cell of the stack of battery cells having a top comprising a battery cell terminal and a bottom opposite the top, wherein the stack of battery cells is positioned such that the top of each battery cell faces outwardly away from the receptacle area; and
an integrated sensing and bus bar subassembly positioned against the stack of battery cells, wherein the integrated sensing and bus bar subassembly comprises a carrier, a bus bar integrated onto the carrier, and a biasing member integrated onto the carrier;
wherein the bus bar is configured to electrically couple battery cells of the stack of battery cells in an electrical arrangement; and
wherein the biasing member is positioned directly between the top of each battery cell of the stack of battery cells and the carrier, wherein the biasing member comprises a first material that is more compliant than a second material of the carrier, wherein the biasing member biases the stack of battery cells inwardly toward the housing, wherein the biasing member is integrated onto the carrier via a friction fit created by a projection of the carrier positioned within a corresponding recess of the biasing member, and wherein the recess of the biasing member comprises an indentation configured to conform around the projection of the carrier to contact opposing surfaces of the projection.

2. The battery module of claim 1, wherein the projection comprises a cutout configured to accommodate a battery cell sleeve disposed about one battery cell of the stack of battery cells.

3. The battery module of claim 2, wherein the cutout comprises a depth and a width corresponding to an increased height and an increased width of the battery cell caused by the battery cell sleeve.

4. The battery module of claim 2, wherein the stack of battery cells comprises a first battery cell, a second battery cell having the battery cell sleeve, and a third battery cell, the second battery cell is positioned between the first battery cell and the third battery cell, and the cutout is in a position on the projection corresponding to the second battery cell.

5. The battery module of claim 1, wherein the projection comprises a lip configured to secure the biasing member on the projection.

6. The battery module of claim 1, wherein the biasing member is integrated onto the carrier via an adhesive.

7. The battery module of claim 1, comprising a thermal transfer layer disposed between an interior surface of the housing and the bottoms of the battery cells of the stack of battery cells, wherein the thermal transfer layer is configured to facilitate thermal transfer from the stack of battery cells to a thermal management feature disposed on an exterior surface of the housing, and the thermal transfer layer comprises a compliant material.

8. The battery module of claim 7, wherein the thermal management feature comprises a heat sink, a heat fin, or another device configured to receive thermal energy.

9. The battery module of claim 1, comprising an additional biasing member, wherein the biasing member and the additional biasing member are configured to abut the top of each battery cell such that a vent of each battery cell is positioned between the biasing member and the additional biasing member.

10. The battery module of claim 1, wherein the biasing member comprises a Shore A Hardness value of between 40 and 60.

11. The battery module of claim 1, wherein the biasing member comprises an elastomer, a polyolefin, a mixture of an elastomer and another polymer, a polyester, or any combination thereof.

12. The battery module of claim 11, wherein the biasing member further comprises a filler material configured to provide structural reinforcement.

13. The battery module of claim 1, wherein the battery module does not comprise an actuatable compression mechanism.

14. The battery module of claim 1, wherein a width of the recess of the biasing member is less than a thickness of the projection.

15. The battery module of claim 1, wherein the biasing member directly contacts the top of each battery cell of the stack of battery cells and the carrier.

* * * * *

UNITED STATES PATENT AND TRADEMARK OFFICE
CERTIFICATE OF CORRECTION

PATENT NO. : 10,199,631 B2
APPLICATION NO. : 14/675618
DATED : February 5, 2019
INVENTOR(S) : Mack et al.

Page 1 of 2

It is certified that error appears in the above-identified patent and that said Letters Patent is hereby corrected as shown below:

In the Specification

1. In Column 1, Line 12, delete "reference, in" and insert --reference in--, therefor.

2. In Column 1, Line 41, delete "full hybrid systems (FHEVs)" and insert --full hybrid electric vehicles (FHEVs)--, therefor.

3. In Column 1, Line 44, delete "mild hybrid systems (MHEVs)" and insert --mild hybrid electric vehicles (MHEVs)--, therefor.

4. In Column 3, Line 41, delete "DRAWINGS" and insert --BRIEF DESCRIPTION OF THE DRAWINGS--, therefor.

5. In Column 4, Lines 10-11, delete "a battery cell having a battery cell having the battery cell sleeve" and insert --a battery cell having the battery cell sleeve--, therefor.

6. In Column 9, Line 59, delete "features" and insert --features.--, therefor.

7. In Column 10, Line 52, delete "casings 58" and insert --casings 78--, therefor.

8. In Column 10, Line 67, delete "casing 58" and insert --casing 78--, therefor.

9. In Column 11, Line 28, delete "casing 58" and insert --casing 78--, therefor.

10. In Column 11, Line 30, delete "casing 58," and insert --casing 78,--, therefor.

11. In Column 11, Line 39, delete "batter cells" and insert --battery cells--, therefor.

12. In Column 11, Line 43, delete "carrier 78." and insert --carrier 102.--, therefor.

Signed and Sealed this
Twenty-sixth Day of March, 2019

Andrei Iancu
*Director of the United States Patent and Trademark Office*

13. In Column 11, Line 47, delete "carrier 78" and insert --carrier 102--, therefor.

14. In Column 13, Line 4, delete "casing 58" and insert --casing 78--, therefor.

15. In Column 13, Line 11, delete "casing 58." and insert --casing 78.--, therefor.